United States Patent [19]

Takaba et al.

[11] 4,179,800
[45] Dec. 25, 1979

[54] PRINTED WIRING BOARD COMPRISING A CONDUCTIVE PATTERN RETREATING AT LEAST PARTLY IN A THROUGH-HOLE

[75] Inventors: Toshio Takaba; Toshimasa Kobayashi, both of Tokyo, Japan

[73] Assignee: Nippon Electric Company, Ltd., Tokyo, Japan

[21] Appl. No.: 906,166

[22] Filed: May 15, 1978

Related U.S. Application Data

[62] Division of Ser. No. 734,169, Oct. 20, 1976, abandoned.

[30] Foreign Application Priority Data

Oct. 20, 1975 [JP] Japan .................................. 50/126170
Nov. 17, 1975 [JP] Japan .................................. 50/138475

[51] Int. Cl.² .............................................. H05K 3/06
[52] U.S. Cl. .................................. 29/625; 174/68.5; 156/656; 427/97; 204/15; 430/314
[58] Field of Search ................. 29/625, 626; 156/653, 156/657, 659, 656; 427/97, 98; 204/15; 96/38.4, 36.2; 174/68.5

[56] References Cited

U.S. PATENT DOCUMENTS

| | | | |
|---|---|---|---|
| 3,143,484 | 8/1964 | Olin et al. | 204/15 |
| 3,185,947 | 5/1965 | Freymodsson | 29/625 X |
| 3,343,256 | 9/1967 | Smith et al. | 96/36.2 X |
| 3,354,543 | 11/1967 | Lawrence et al. | 29/625 |
| 3,702,284 | 11/1972 | Merkenschlager | 204/15 |
| 3,873,429 | 3/1975 | Brown | 29/625 X |

*Primary Examiner*—Francis J. Husar
*Assistant Examiner*—C. J. Arbes
*Attorney, Agent, or Firm*—Sughrue, Rothwell, Mion, Zinn and Macpeak

[57] ABSTRACT

In a printed wiring board having an outwardly flaring through-hole, a conductive pattern is formed on the inwardly directed surface of the hole so as to reach a principal surface of the board only at that circumferential portion of the hole where the pattern is continuous to a pattern portion, if any, formed on the principal surface. The pattern is formed in the through-hole by positive use of that portion of a photoresist film formed on the principal surface to cover the hole which partly protrudes into the hole.

1 Claim, 20 Drawing Figures

PRINTED WIRING BOARD COMPRISING A CONDUCTIVE PATTERN RETREATING AT LEAST PARTLY IN A THROUGH-HOLE

This is a division of application Ser. No. 734,169, filed Oct. 20, 1976, now abandoned.

BACKGROUND OF THE INVENTION

This invention relates to a printed circuit or wiring board having a plated outwardly flaring through-hole and a method of making the same.

As will be described later with reference to several figures of the accompanying drawings, a printed wiring board is manufactured by applying a photoresist film on each principal surface of the board, exposing the photoresist film to light through a mask having a positive or a negative mask pattern, removing the photoresist film to uncover a desired area of the principal surface, and depositing a conductive pattern on the desired area. A printed wiring board generally has a plurality of through-holes. The conductive pattern is formed also in the through-holes to provide supports for circuit elements to be mounted on the board and electrical connections thereto and between the conductive pattern portions formed on both principal surfaces. In order to insure the supports and connections, edges or borders of the conductive pattern have been extended onto those portions of the principal surface which surround the through-hole openings. Due to the pattern borders, it has been unavoidable that a restriction is imposed on the density of the conductive pattern and that difficulties are encountered on bringing the mask pattern in register with the through-holes and on manufacturing the mask.

A printed wiring board comprising a metal core is disclosed by Donald Dinella in U.S. Pat. No. 3,296,099 and in two technical publications, *The Western Electric Engineer,* July 1965 issue, pages 24–29, and July 1973 issue, pages 18–25. A metal-core printed wiring board is preferred to a printed wiring board comprising a solid insulator substrate because the former is dimentionally more stable, mechanically stronger, more heat-dissipating, and yet less expensive. When made of a magnetic material, such as mild steel, the metal core serves as a magnetic shield and provides a magnetic circuit. Through-holes of a metal-core printed wiring board have funnel-shaped or outwardly flaring hole-end surfaces. The hole-end diameter of each through-hole is longer than the diameter of an inner principal portion of the through-hole. Insofar as the present applicants are aware of, the pattern edges or borders of a metal-core printed wiring board have also been extended to the through-hole surrounding portions. As a result, a conventional metal-core printed wiring board has been defective as regards the less dense conductive pattern and the above-mentioned difficulties.

SUMMARY OF THE INVENTION

It is therefore an object of the present invention to provide a printed wiring board and a method of manufacturing the same, whereby it is possible to raise the density of a conductive pattern comprised by the printed wiring board.

It is another object of this invention to provide a printed wiring board of the type described and a method of manufacturing the same, wherefor it is possible during manufacture to easily bring a mask in register with through-holes of the printed circuit board.

It is still another object of this invention to provide a printed wiring board of the type described and a method of manufacturing the same, wherefor it is possible to readily manufacture a mask for use in producing printed wiring boards having same conductive patterns.

This invention is applicable to a printed wiring board having a pair of principal surfaces and a through-hole having, in turn, an inwardly directed surface and an outwardly flaring surface which connects the inwardly directed surface to one of the principal surfaces and is contiguous to the above-mentioned one principal surface along a boundary portion. The wiring board comprises an electrically conductive pattern on the inwardly directed and outwardly flaring surfaces. In accordance with this invention, the conductive pattern does not reach the above-mentioned one principal surface at least partially circumferentially of the boundary portion.

The method of manufacturing a printed wiring board according to the invention comprises the step of providing a substrate having a pair of principal surfaces and a through-hole having, in turn, an inwardly directed surface and an outwardly flaring surface which connects the inwardly directed surface to one of the principal surfaces and is contiguous to the above-mentioned one principal surface along a boundary portion. In accordance with this invention, the method further comprises the step of forming an electrically conductive pattern selectively on the inwardly directed and outwardly flaring surface so as not to reach the above-mentioned one principal surface at least partially circumferentially of the boundary portion.

BRIEF DESCRIPTION OF THE DRAWINGS

The specific nature of the invention, as well as other objects, aspects, uses and advantages thereof, will cearly appear from the following description and the accompanying drawings, in which.

DESCRIPTION OF THE PREFERRED EMBODIMENTS

Figure 1:
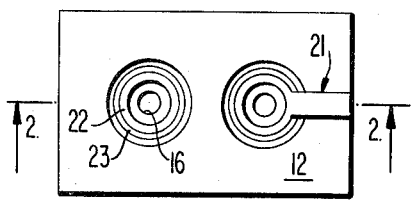
FIG. 1 is a plan view of a typical printed wiring board according to a preferred embodiment of the present invention.
Figure 2:
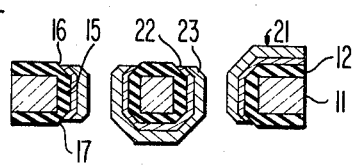
FIG. 2 is a sectional view of the printed wiring board taken along the section line 2—2 in FIG. 1.

Referring to FIGS. 1 and 2, a printed circuit or wiring board according to a preferred embodiment of the present invention comprises a substrate having a pair of principal surfaces and a through-hole. The substrate comprises, in turn, a metal core 11 having a pair of core principal surfaces and a hole which is for providing the through-hole and has a hole surface intersecting the core principal surfaces at a pair of circumferential edges. Inasmuch as the so-called printed circuit or wiring is to be formed on the substrate, the metal core 11 is covered with an insulation layer 12. The hole surface is also covered with the insulation layer 12. The through-hole thus has an inwardly directed surface 15 and a pair of outwardly flaring surfaces 16 and 17 which connect the inwardly directed surface 15 to the respective substrate principal surfaces and are contiguous to the principal surfaces along a pair of boundary portions. Each outwardly flaring surface 16 or 17 may have a circumferential edge as shown to define a clear boundary portion or line. Alternatively, each outwardly flaring surface 16 or 17 may merge into the associated principal surface so that a boundary line should be defined, if necessary instead of a somewhat wider boundary portion, by a locus of points at which the slope with reference to the principal surfaces of a line tangential to the outwardly flaring surface 16 or 17 and included in a plane perpendicular to the principal surface varies from a finite value to zero. In either event, each outwardly flaring surface 16 or 17 has a radius that gradually increases as the outwardly flaring surface 16 or 17 approaches the related principal surface axially of the through-hole.

Further referring to FIGS. 1 and 2, the printed wiring board comprises in accordance with this invention an electrically conductive pattern 21 on the inwardly directed surface and the outwardly flaring surfaces 16 and 17 so as not to reach the principal surfaces at least partially circumferentially or peripherally of the boundary portions. For the outwardly flaring surface 16 depicted on the left by a solid line in FIG. 1 and upwardly flaring in FIG. 2, the conductive pattern 21 does not reach the adjacent principal surface wholly circumferentially of the associated boundary portion. For each of other shown outwardly flaring surfaces, such as 17, the conductive pattern 21 reaches the related principal surface at a predetermined part of the boundary portion and is extended on the principal surface. Although not shown, the conductive pattern 21 may reach the associated principal surface at a plurality of predetermined parts of the related boundary portion to be extended radially outwardly as a like number of conductive pattern portions formed on the principal surface. In the example being illustrated, the conductive pattern 21 comprises a metallized layer 22 on the substrate surface and an electrically conductive layer 23 on the metallized layer 22. It will be understood that the conductive pattern portion which is formed on the outwardly flaring surface 16 or 17 and does not reach the associated boundary portion serves as a pattern edge or border and that the outside diameter of the pattern border is thus shorter than the diameter of the end opening of the outwardly flaring surface 16 or 17. The difference between these two diameters is not critical.

Figure 3:
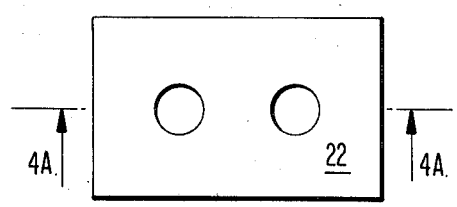
FIGS. 3A, 3B, 3C, 3D and 3E illustrate plan views of a conventional printed wiring board during manufacture.
Figure 4:
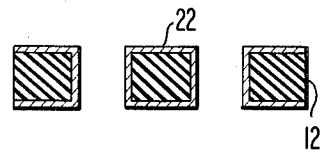
FIGS. 4A, 4B, 4C, 4D and 4E show sectional views of the conventional printed wiring board which are taken along the section lines 4A—4A, 4BA—4B, 4C—4C, 4D—4D and 4E—4E, respectively, in FIGS. 3A, 3B, 3C, 3D, and 3E.
Figure 3:
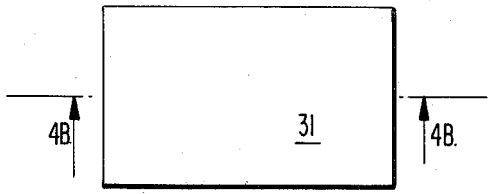
Figure 4:
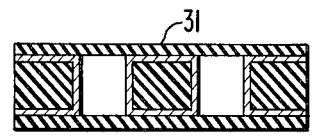
Figure 3:
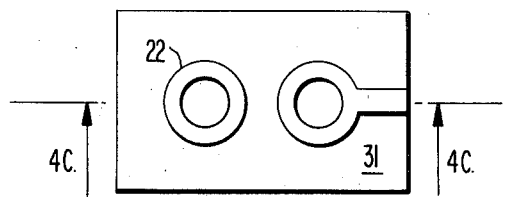
Figure 4:
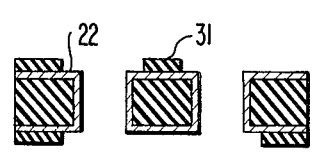
Figure 3:
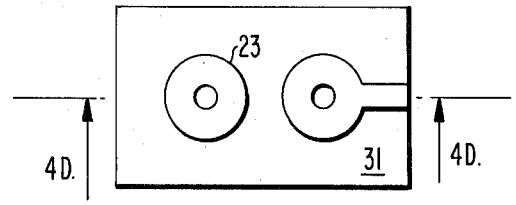
Figure 4:
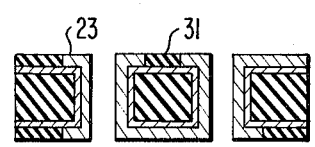
Figure 3:
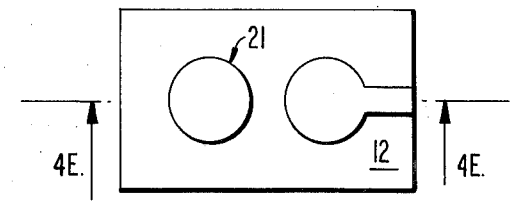
Figure 4:
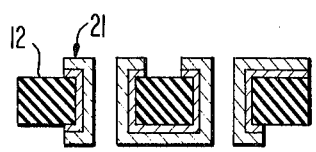

Referring now to FIGS. 3 and 4, a conventional method of manufacturing a printed wiring board will be described in order to facilitate an understanding of the present invention. In the example being illustrated, the printed wiring board does not comprise the metal core 11 but a solid insulator substrate 12. Furthermore, each through-hole does not have the outwardly flaring surfaces 16 and 17. At any rate, the principal surfaces of the substrate 12 and the inwardly directed surface of each through-hole are metallized to provide as best shown in FIGS. 3A and 4A a metallized layer 22. As schematically depicted in FIGS. 3B and 4B, a photoresist film 31 is applied to each principal surface to cover the through-holes. The photoresist film 31 is exposed to light through a mask (not shown) having a predetermined mask pattern and subsequently developed to expose as shown in FIGS. 3C and 4C a desired area of the metallized layer 22. The inwardly directed surface of each through-hole is thereby also exposed. After the exposed area of the metallized layer 22 is pretreated in a usual manner, an electrically conductive layer 23 is deposited on the pretreated metallized layer area as shown in FIGS. 3D and 4D. The deposition is preferably carried out by copper electroplating of the board depicted in FIGS. 3C and 4C. After removal of the remaining photoresist film portion by a known agent therefor and subsequent quick etch of the thereby exposed metallized layer portion, a conventional printed wiring board comprising an electrically conductive pattern 21 is obtained as shown in FIGS. 3E and 4E.

Figure 5:
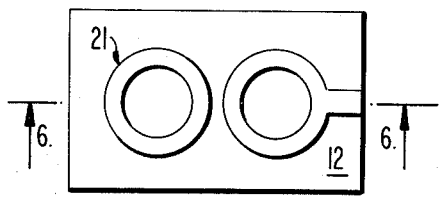
FIG. 5 is a plan view of a conventional printed wiring board.
Figure 6:
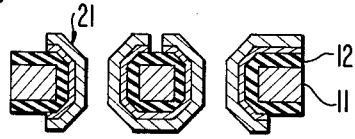
FIG. 6 is a sectional view of the last-mentioned conventional printed wiring board taken along section line 6—6 in FIG. 5.

Referring to FIGS. 5 and 6, a conventional metal-core printed wiring board is illustrated with similar elements designated by like reference numerals. In contrast to a printed wiring board illustrated with reference to FIGS. 1 and 2, the pattern edges are extended in a conventional printed wiring board on those portions of the principal surface which surround the through-hole openings. As pointed out in the preamble of the instant specification, the density of the conductive pattern 21 has been unavoidably restricted due to the extended pattern edges or borders. Furthermore, it has been mandatory to bring a mask pattern (not shown) for the pattern borders into strict registery with the through-holes. In order to insure this strict registration, the mask has had to be manufactured with great care and consequent considerable difficulty.

Figure 8:
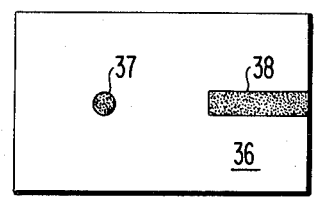
FIG. 8 is a plan view of a mask for use in manufacturing a plurality of printed wiring boards by the method illustrated with reference to FIGS. 7A, 7B, 7C, 7D, and 7E.

Turning to FIGS. 7 and 8, a method according to a preferred embodiment of this invention is similar to a conventional method illustrated with reference to FIGS. 3 and 4. Similar parts are again designated by like reference numerals. As will be understood by comparison of FIGS. 7A, 7B, 7C, 7D and 7E with the corresponding views shown in FIG. 4, the method according to this invention is characterized by the step exemplified in FIGS. 7C through 7E and FIG. 8 of forming an electrically conductive pattern 21 selectively on an inwardly directed and outwardly flaring surfaces 15 through 17 so as not to reach the board principal surfaces at least partially circumferentially of boundary portions between the outwardly flaring surfaces 16 and 17 and the principal surfaces. It may be mentioned here that a photoresist film 31 as called hereinabove is preferably a photosensitive polymer film comprising a photosensitive layer and a covering polyester layer and may further comprise a polyethylene layer covering that surface of the photosensitive layer which is not covered with the polyester layer. The three-layer film may be a LAMINER HS FILM manufactured and sold by Dynachem Corp., California, and is applied to each principal surface of a substrate for the board by the use of a hot resilient roller at a temperature of about 100° C. or somewhat higher and by removing in the meantime the polyethylene layer so as to bring a newly exposed surface of the photoresist layer into direct contact with the principal surface. A machine comprising the roller mentioned above and means for removing the protective polyethylene layer may be a Laminater Model 250 manufactured and sold by the above-mentioned Dynachem Corp. Alternatively, the photoresist film 31 may be applied to the principal surface or surfaces by any other known method of forming a photoresist. In any event, the photoresist film 31 partly protrudes into the through-hole as best shown in FIG. 7B although such a partial protrusion is not depicted in FIG. 4B in order to simplify the illustration and because the partial protrusion or protrusions have never been positively used in conventional methods.

Figure 7A:
FIGS. 7A, 7B, 7C, 7D and 7E illustrate sectional views of a printed wiring board during manufacture by the method according to a preferred embodiment of this invention.
Figure 7B:
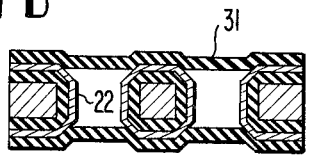

Referring to FIG. 7 more in detail, a metallized layer 22 is formed as shown in FIG. 7A on the substrate either by evaporation or electroless plating. The metallized layer 22 includes a first, a second, and a third portion formed on each principal surface, a boundary portion between each outwardly flaring surface 16 and 17 and the associated principal surface, and on that part of the principal surface which corresponds to a desired area mentioned hereinabove and on which each electrically conductive layer 23 is subsequently formed in the manner described hereunder. As mentioned in the next preceding paragraph and exemplified in FIG. 7B, a photoresist film 31 is applied to each principal surface. Inasmuch as use is made of the metallized layer 22 in the example being illustrated the photoresist film 31 is in contact with the first and second metallized layer portions and protrude partly into each through-hole.

Referring also to FIG. 8 briefly, a mask 36 for use in putting the method according to the preferred embodiment into practice has as mask pattern defining, for example, a first area, such as a dot-shaped area 37 and an elongated area 38. The dot-shaped area 37 is narrower than a second area surrounded by the second metallized layer portion. The elongated area 38 has an end which is also narrower than the second area. The photoresist film 31 is exposed to light with the first area of the mask 36 brought into substantial registery with the second area of the photoresist film 31. For convenience of further description, those portions of the photoresist film 31 are called a first and a second portion which corresponds and do not correspond to the first area or areas, respectively.

Figure 7C:
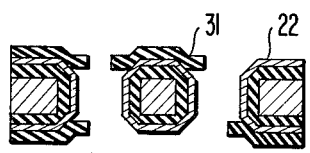
Figure 7D:
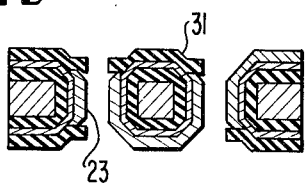
Figure 7E:
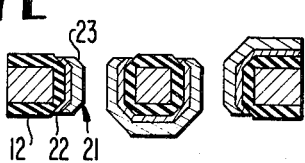

Referring to FIG. 7 again in detail, the first photoresist film portion is developed away to leave the second photoresist film portion and to uncover or expose a desired area of the metallized layer 22, namely, the third metallized layer portion, as exemplified in FIG. 7C. After the unusal pretreatment of the exposed area of the metallized layer 22, the conductive layer 23 is deposited on the exposed and pretreated area as shown in FIG. 7D. Electroplating is preferred because the electrolyte thereby used readily fills the through-holes. As in a conventional method, the second photoresist film portion is removed, followed by quick etch or the like process to remove that portion of the metallized layer 22 on which the conductive layer 23 is not formed. It will be understood that the second photoresist film portion remains throughout the conductive layer forming step. As shown in FIG. 7E, a printed wiring board thereby obtained comprises a conductive pattern 21 that does not reach the principal surface of the substrate at least partially circumferentially of the boundary portion between the principal surface and a related outwardly flaring surface 16 or 17 of each through-hole.

While this invention has thus far been described in specific conjunction with a printed wiring board and a method of manufacturing the same according to the respective preferred embodiments, it should clearly be understood that this invention is equally well applicable to a printed wiring board and a method of making the same wherein the substrate of the board does not comprise a metal core but a through-hole having an axially outwardly flaring surface 16 or 17 contiguous to at least one of the principal surfaces of the board. Inasmuch as the outline of each pattern edge, namely, the conductive pattern portion formed on each outwardly flaring surface 16 and 17 and retreating in accordance with this invention in the through-hole has a diameter smaller than the diameter of the outwardly flaring end, it is possible to raise the density of the conductive pattern of the board even compared with the density for a conventional printed wiring board illustrated with reference to FIGS. 3 and 4. Inasmuch as the boundary portion between an outwardly flaring surface 16 and 17 and the associated principal surface does not make an acute angle, it is possible to insure the electrical connection between the conductive pattern portion formed on the principal surface and the pattern portion formed on the inwardly directed surface 15 of each through-hole. Inasmuch as the above-mentioned outline is decided by that portion of the photoresist film 31 which partly protrudes into the through-hole rather than by that first area, such as a dot-shaped pattern 37 or an end of an elongated pattern 38, of the mask 36 which is brought into substantial registery with a through-hole, it is readily possible to bring the first area into substantial registery with the through-hole. This simplifies and facilitates manufacture of a mask 36. Furthermore, the dot-shaped area 36, if any, may not be exactly concentric with the through-hole therefor but may be either rectangular as suggested by the end of the elongated area 38 or just a point-like area of any shape. This applies to an end of an elongated pattern 38.

What is claimed is:

1. In a method of manufacturing a printed wiring board including the step of providing a substrate having a pair of principal surfaces and a through-hole having, in turn, an inwardly directed surface and an outwardly flaring surface connecting said inwardly directed surface to one of said principal surfaces and being contiguous to said one principal surface along a boundary portion, the improvement comprising the steps of:

forming a metallized layer on said one principal surface, boundary portion and outwardly flaring and inwardly directed surfaces so that a first portion of said metallized layer is formed on said one principal surface and a second portion of said metallized layer is formed on said boundary portion;

applying a photoresist film on said first metallized layer portion to cover said through-hole and protrude in contact with said second metallized layer portion partly into said through-hole;

exposing said photoresist film to light by the use of a mask defining a first area narrower than a second area surrounded by said second metallized layer portion with said first area placed in substantial registry with said second area;

removing that first portion of said photoresist film which corresponds to said first area to uncover that third portion of said metallized layer which is surrounded as defined by said first area by said second metallized layer portion and is formed on said inwardly directed surface;

depositing an electrically conductive layer on said third metallized layer portion so as not to reach said first metallized layer portion wholly circumferentially of said second metallized layer portion;

removing that second portion of said photoresist film which does not correspond to said first area and has remained after said first photoresist film portion removing step throughout said conductive layer forming step; and removing that portion of said metallized layer on which said conductive layer is not formed.

* * * * *